United States Patent
Wang et al.

(10) Patent No.: US 9,209,119 B1
(45) Date of Patent: Dec. 8, 2015

(54) SEMICONDUCTOR DEVICE ASSEMBLED USING TWO LEAD FRAMES

(71) Applicants: Huan Wang, Tianjin (CN); Hejin Liu, Tianjin (CN); Weiping Sun, Tianjin (CN)

(72) Inventors: Huan Wang, Tianjin (CN); Hejin Liu, Tianjin (CN); Weiping Sun, Tianjin (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/554,064

(22) Filed: Nov. 26, 2014

(30) Foreign Application Priority Data

Jun. 4, 2014 (CN) .......................... 2014 1 0357286

(51) Int. Cl.
*H01L 23/495* (2006.01)
*H01L 21/48* (2006.01)
*H01L 21/56* (2006.01)
*H01L 21/78* (2006.01)
*H01L 23/31* (2006.01)

(52) U.S. Cl.
CPC ...... *H01L 23/49555* (2013.01); *H01L 21/4825* (2013.01); *H01L 21/561* (2013.01); *H01L 21/565* (2013.01); *H01L 21/78* (2013.01); *H01L 23/3114* (2013.01); *H01L 23/4952* (2013.01)

(58) Field of Classification Search
CPC ............................................ H01L 2224/48247

USPC ......................................................... 257/666
See application file for complete search history.

(56) References Cited

U.S. PATENT DOCUMENTS

| | | |
|---|---|---|
| 6,427,976 B1 | 8/2002 | Huang |
| 6,459,148 B1 | 10/2002 | Chun-Jen |
| 6,917,097 B2 | 7/2005 | Chow et al. |
| 7,033,866 B2 | 4/2006 | Chow et al. |
| 7,960,815 B2 | 6/2011 | Camacho |
| 8,709,875 B2 | 4/2014 | Yao et al. |
| 2004/0089928 A1* | 5/2004 | Nakajima ............. H01L 21/565 257/678 |
| 2012/0112332 A1* | 5/2012 | Minamio .............. H01L 21/565 257/675 |
| 2012/0299166 A1* | 11/2012 | Minamio ............. B21D 39/032 257/666 |
| 2013/0015567 A1* | 1/2013 | Minamio ........... H01L 23/4334 257/676 |
| 2013/0221502 A1* | 8/2013 | Minamio ........... H01L 23/4334 257/666 |

* cited by examiner

*Primary Examiner* — Anthony Ho
(74) *Attorney, Agent, or Firm* — Charles Bergere

(57) ABSTRACT

A packaged semiconductor device is assembled using a first lead frame upon which a die is mounted and encapsulated and a second lead frame that provides bent leads for the device. By using two different lead frames, an array of the first lead frames can be configured with more lead frames for more devices than a comparably sized lead frame array of the prior art because the first lead frame array does not need to provide the leads for the packaged devices. Instead, the leads are provided by the second lead frame array, which can be attached to the first lead frame array after the dies have been mounted and encapsulated on the first lead frame array.

3 Claims, 5 Drawing Sheets

SEMICONDUCTOR DEVICE ASSEMBLED USING TWO LEAD FRAMES

BACKGROUND OF THE INVENTION

The present invention relates generally to semiconductor devices and, more particularly, to a semiconductor device assembled using two lead frames.

A quad flat package (QFP) semiconductor device is a semiconductor device with bent "gull wing" leads extending from the semiconductor device. The bent leads make this type of device easy to solder. A standard QFP semiconductor device made with bent leads is assembled as shown in FIGS. 1A-1F, described below in more detail.

FIG. 1A shows a die 104 die bonded to a lead frame 102 having leads 110. The die 104 is also electrically connected to the lead frame 102 using bond wires 106. FIG. 1B shows the die 104, bond wires 106, and part of the lead frame 102 encapsulated in a molding compound 108 with leads 110 extending outside of the molding compound 108.

Multiple semiconductor devices are manufactured together on a one- or two-dimensional assembly of lead frames called a lead frame array. FIG. 1C is a simplified top-down view of a lead frame array 120 having encapsulated dies 104. FIG. 1C is intended to indicate the relative spacing between adjacent encapsulated dies 104 on the lead frame array 120.

In FIG. 1D, singulation is performed by cutting through the leads 110 using a saw or a laser. Singulation is when the individual devices that are assembled on a single lead frame array 120 are separated from one another. After singulation, FIG. 1E shows the leads 110 being forced down to form the bent leads 110 of FIG. 1F. As shown in FIG. 1F, the bent leads 110 extend outwardly from mid-portion 113, which is at or near the middle of the device thickness of the formed semiconductor device 100.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

FIGS. 1A-1B and 1D-1F show simplified cross-sectional views of different stages in the assembly of a conventional QFP semiconductor device, while

DETAILED DESCRIPTION OF THE INVENTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1A:
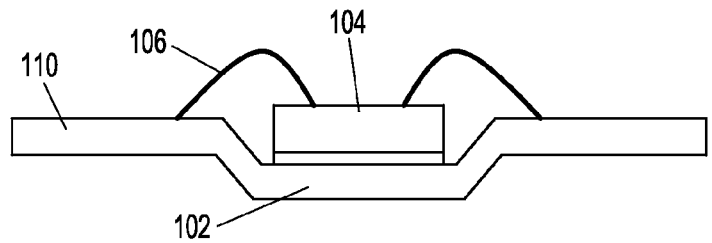
Figure 1B:
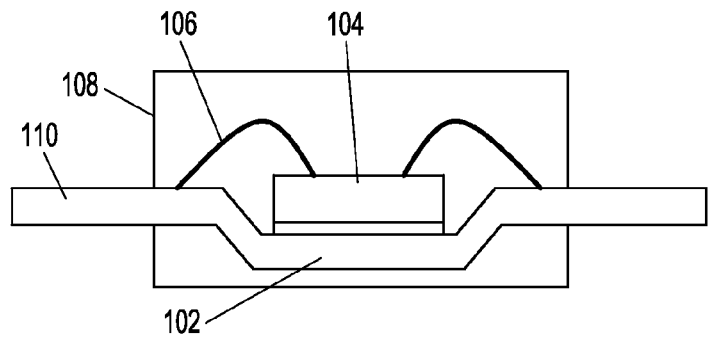
Figure 1C:
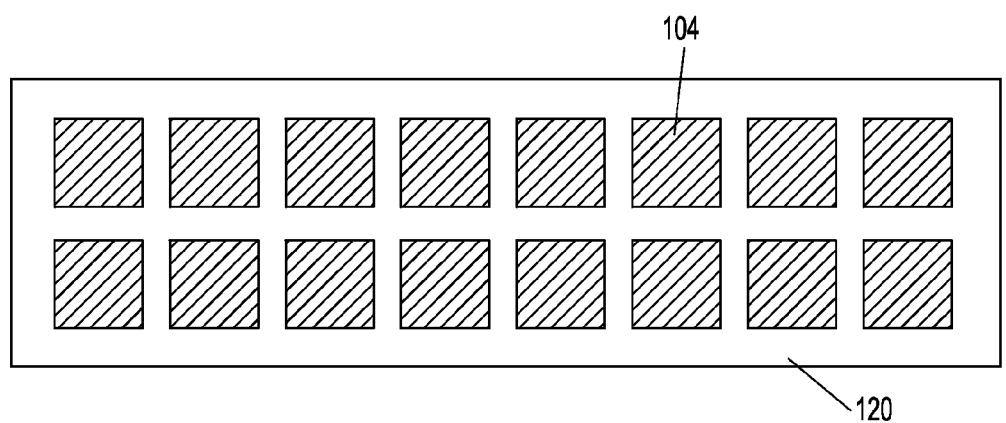
FIG. 1C shows a simplified top down view of a lead frame array having encapsulated dies before singulation.
Figure 1D:
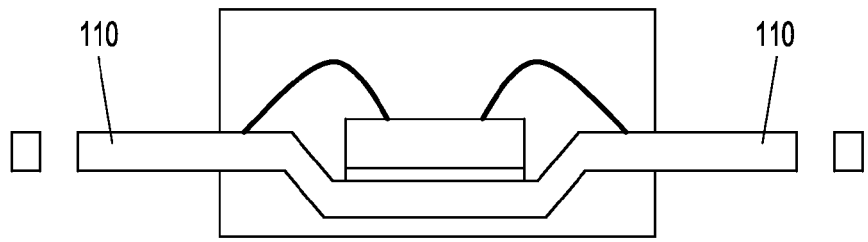
Figure 1E:
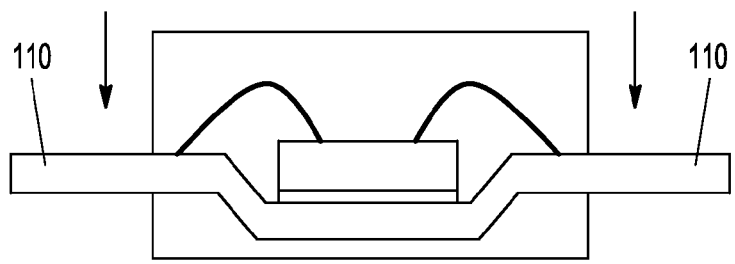
Figure 1F:
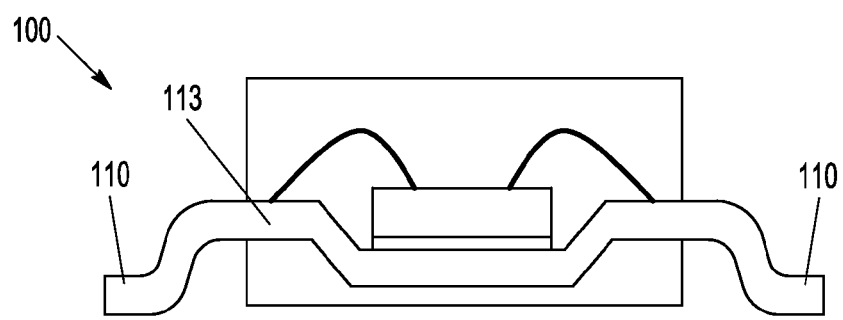

When semiconductor devices are constructed in the manner described above with respect to FIGS. 1A-1F, the number of semiconductor devices that can be manufactured in a lead frame array are limited. Using the same lead frame array for both mounting the die and forming the leads, as shown in FIG. 1C, means that the number of dies that can be assembled on the lead frame array is restricted due to the need for the same lead frame array to also be used to form the leads.

Assembling the semiconductor devices in the manner of FIGS. 1A-1F also increases the length of the process. Additional steps need to be performed in the formation of the bent leads.

As used herein, a lead frame is a collection of metal leads and possibly other elements (e.g., die paddles (also known as die pads or die flags, power bars, etc.) that is used in semiconductor packaging for assembling a single packaged semiconductor device. Prior to assembly into a packaged device, a lead frame may have support structures (e.g., forming a rectangular metal frame) that keep those elements in place. During the assembly process, the support structures may be removed. As used herein, the term "lead frame" may be used to refer to the collection of elements before assembly or after assembly, regardless of the presence or absence of those support structures.

There is a need to improve the assembly process of semiconductor devices while retaining the improved solderability provided by having leads, such as bent "gull wing" leads. The assembly process can be improved by using two lead frames for each device: one for mounting the die(s) and one to provide the leads. Assembling semiconductor devices in this manner increases the number of semiconductor devices that can be assembled at one time using a one- or two-dimensional lead frame array, while reducing the number of steps involved in the process of making the semiconductor devices.

In one embodiment, the present invention is a method of manufacturing a semiconductor device. The method comprises forming a sub-assembly comprising a die mounted on a first lead frame. The method further comprises attaching a second lead frame to the sub-assembly, wherein the second lead frame provides leads for the packaged semiconductor.

Figure 2A:
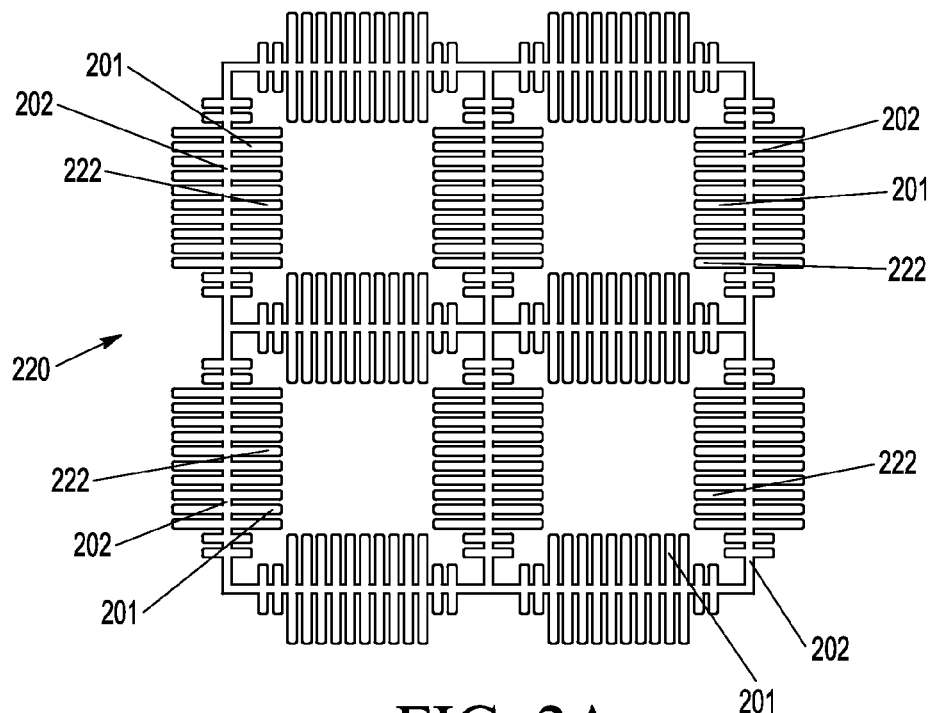
FIGS. 2A and 2B show simplified top down views of lead frame arrays.

FIG. 2A shows a simplified top down view of a first (2×2) lead frame array 220 having four lead frames 202 made in accordance with an embodiment of the invention. The lead frame array 220 forms the structure on which dies and bond wires are attached. The lead frame array 220 may be manufactured using an etching process. Using an etching process makes the lead frame array thin and easy to cut during singulation. In other embodiments, another process, such as stamping, may be used to form the lead frame array. Lead frame arrays may have more lead frames than that which is shown in FIG. 2A, and the number of lead frames shown is simply for the ease of explanation.

As shown in FIG. 2A, the lead frame array 220 comprises lead frames 202 and support lead frame fingers 222 that extend into the interior of each lead frame 202. The support structures will eventually be removed during subsequent device singulation. Each lead frame 202 will have a die that is attached to the top surface 201 of some of the lead frame fingers 222 during the assembly process.

Figure 2B:
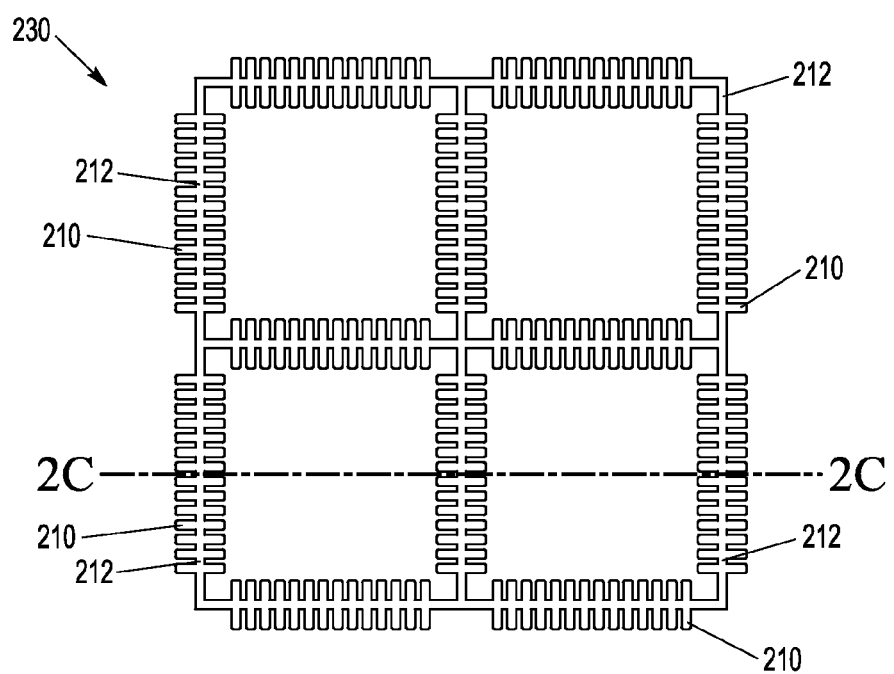

FIG. 2B shows a simplified top down view of a second (2×2) lead frame array 230 having four lead frames 212 made in accordance with an embodiment of the invention. The second lead frame array 230 provides the leads for the final assembled semiconductor devices. The lead frame array 230 is formed using a stamping process in order to form a flattened lead frame array which then undergoes a bending process to form bent "gull wing" leads 210, which are shown more clearly in the cross-sectional view of FIG. 2C. It should be understood that second lead frame arrays may be formed by processes other than a stamping process. Additionally, while bent leads are formed in the embodiment disclosed herein, other types of leads may be formed depending upon the semiconductor device being constructed.

As represented in FIG. 2B, the lead frames 212 of the lead frame array 230 are interconnected and support leads 210. During the subsequent singulation process, the support structures will be removed.

Second lead frame arrays may have more lead frames than that which is shown in FIG. 2B. Each second lead frame 212 will be attached to a corresponding first lead frame, as discussed further below.

Figure 2C:
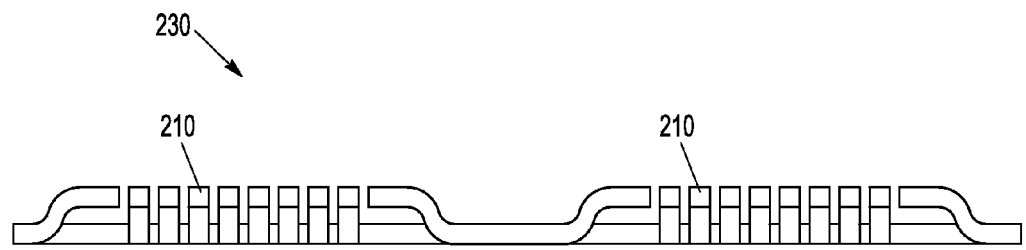
FIG. 2C shows a cut-away side view of FIG. 2B taken along line 2C-2C of FIG. 2B, and FIGS. 2D-2G show simplified cross-sectional side views of different stages in the assembly of a semiconductor device in accordance with an embodiment of the invention.
Figure 2D:
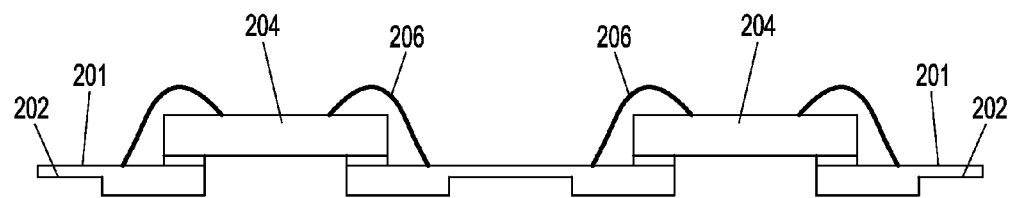

FIG. 2D shows first lead frames 202 after dies 204 have been die bonded to the top surfaces 201 of the first lead frames 202. Dies 204 may be die bonded with conventional, electrically insulating die-attach adhesive. Those skilled in the art will understand that suitable alternative means, such as die-attach tape, may be used to attach some or all of these dies. The dies 204 are wire bonded to the first lead frames 202 using one or more bond wires 206. Bond wires 206 may be formed from a different conductive material such as aluminum, gold, or copper, and may be either coated (i.e., insulated) or uncoated (i.e., uninsulated). Note that, in alternative embodiments, in addition to or instead of using bond wires, a die may be electrically connected to the first lead frame using flip-chip or other related techniques.

Figure 2E:
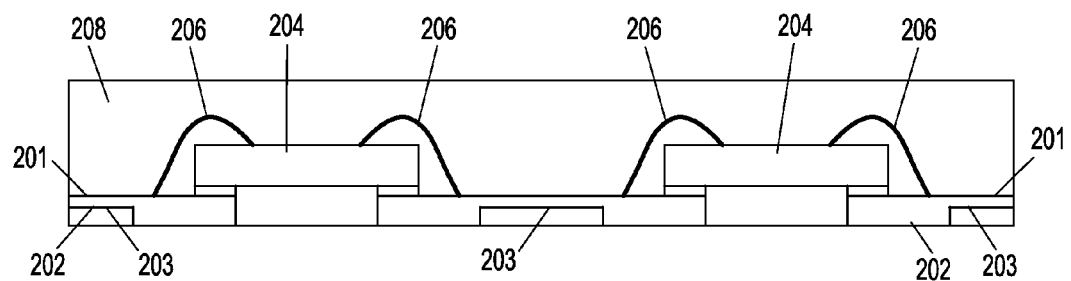

FIG. 2E shows wire bonded and die bonded dies 204 encapsulated in molding compound 208. The molding compound 208 encapsulates the bond wires 206, the dies 204, the top surfaces 201, and portions of the bottom surfaces 203 of the lead frames 202. The molding compound 208 provides protection for the components of the semiconductor device. The molding compound 208 may be applied as a liquid polymer, which is then cured to form a solid using UV or heat. Alternatively, the molding compound 208 can be a solid that is heated to form a liquid for application and then cooled in place to form a solid encapsulant. Subsequently, heat may be applied to cure the molding compound 208 to complete the cross linking of the polymer. The molding compound 208 may be a plastic, an epoxy, a silica-filled resin, a ceramic, a halide-free material or the like, or combinations thereof, as is known in the art.

Figure 2F:
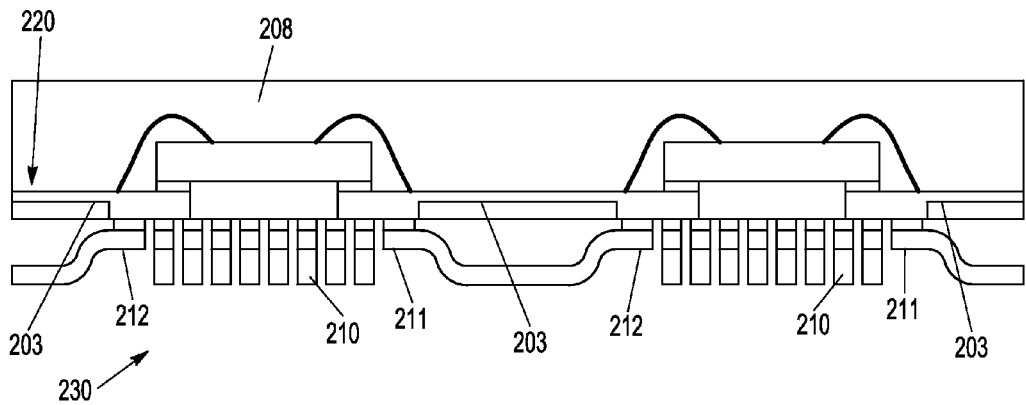

In FIG. 2F, the assembly of FIG. 2E with first lead frame array 220 has been attached to the second lead frame array 230 of FIGS. 2B and 2C. The first lead frame array 220 is attached to the second lead frame 230 by soldering the lead frames together using solder paste. The first and second lead frames can also be attached using tape. In particular, the top surface 211 of the second lead frame 212 is electrically attached to the exposed bottom surface 203 of the first lead frame 202, such that the bent leads 210 extend downward and then outward from the bottom surface 203 of the first lead frame 202.

Figure 2G:
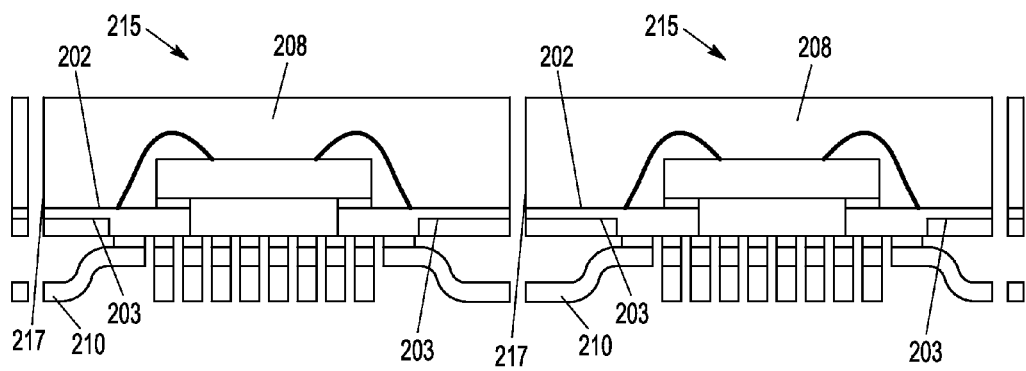

After the attachment of the first lead frame array 220 to the second lead frame array 230, the resulting sub-assembly shown in FIG. 2F undergoes a singulation process, the results of which are shown in FIG. 2G, where the sub-assembly is sawed or subjected to laser cutting to form individual packaged semiconductor devices 215. The bent leads 210 remain extending beneath the bottom surface 203 of the first lead frame 202 and do not extend beyond the perimeter 217 of the packaged device 215. Note that, during singulation, lead frames 202 of FIG. 2A and lead frames 212 of FIG. 2B are removed, leaving the encapsulated lead frame fingers 222 and attached leads 210 in place.

The process described above improves the assembly process by not having the leads formed from the same lead frame on which the die is bonded. By using a second lead frame for the leads, the die may be mounted separately on a first lead frame and the resulting sub-assembly mounted to the second lead frame, thereby allowing more process time to be spent on assembling the dies instead of using that machinery in forming the leads.

Figure 3:
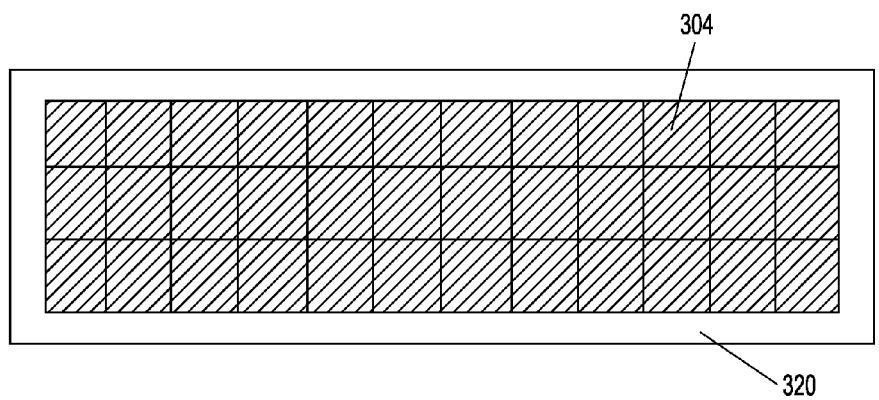
FIG. 3 shows a simplified top-down view of a lead frame array having encapsulated dies in accordance with an embodiment of the invention.

Additionally, since room does not need to be reserved for leads, the first lead frame array may be designed to receive more dies per unit area than prior-art lead frames that do reserve room for leads. FIG. 3 shows a lead frame array 320 having closely spaced dies 304 mounted thereon, made in accordance with an embodiment of the invention. In comparison to the lead frame array 120 shown in FIG. 1C, more dies 304 are able to be mounted on a similarly dimensioned lead frame.

In a conventional assembly process, dies are mounted and encapsulated on a flat lead frame array, and the leads of that lead frame array are not bent until the end of the assembly process, for example, after singulation. As such, the number of devices that can be assembled using a lead frame array of a given length and width is a function of the lengths of the unbent leads. Using two different lead frame arrays, i.e., a first lead frame to receive the dies and a second lead frame to provide the leads, enables more devices to be assembled within assembly machinery that can accommodate lead frame arrays having a certain length and width, because the first lead frame array that receives the dies can be configured based on the lateral dimensions of the devices after the leads are bent. In this way, more devices can be assembled at a time using assembly machinery that has the same size as assembly machinery used for the prior-art assembly process. Depending on the particular implementation, the same prior-art assembly machinery can be used to assemble more devices at a time using the method of the present invention.

Also, this improved process of assembling the semiconductor devices described above is able to be accomplished without sacrificing the improved solderability provided by having leads.

By now, it should be appreciated that there has been provided an improved semiconductor device and an improved method of making such packaged semiconductor devices. Circuit details are not disclosed because knowledge thereof is not required for a complete understanding of the invention.

Although the invention has been described using relative terms such as "down," "out," "top," "bottom," "over," "above," "under" and the like in the description and in the claims, such terms are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

The invention claimed is:

1. A packaged semiconductor device, comprising:
   a first lead frame;
   a die mounted on the first lead frame;
   a second lead frame attached to the first lead frame, wherein the second lead frame provides gull wing leads for the packaged semiconductor device, wherein the gull wing leads are bent, and do not extend beyond a perimeter of the packaged semiconductor device.

2. The packaged semiconductor device of claim 1, wherein:
   the die is die bonded on the first lead frame and electrically connected to the first lead frame with bond wires; and
   the die and the bond wires are encapsulated within a molding compound.

3. The packaged semiconductor device of claim 1, wherein:
   the die is mounted to a top surface of the first lead frame; and
   the second lead frame is attached to a bottom surface of the first lead frame.

* * * * *